(12) United States Patent
Lynch

(10) Patent No.: US 10,826,498 B2
(45) Date of Patent: Nov. 3, 2020

(54) LOW POWER LOGIC FAMILY

(71) Applicant: Purdue Research Foundation, West Lafayette, IN (US)

(72) Inventor: John K Lynch, Amsterdam, NY (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/798,405

(22) Filed: Feb. 23, 2020

(65) Prior Publication Data
US 2020/0287543 A1 Sep. 10, 2020

Related U.S. Application Data

(60) Provisional application No. 62/814,893, filed on Mar. 7, 2019.

(51) Int. Cl.
*H03K 19/00* (2006.01)

(52) U.S. Cl.
CPC ................................ *H03K 19/0008* (2013.01)

(58) Field of Classification Search
CPC .................................................. H03K 19/0008
USPC ................................................................. 326/82
See application file for complete search history.

(56) References Cited

U.S. PATENT DOCUMENTS

| | | | | |
|---|---|---|---|---|
| 5,701,093 A * | 12/1997 | Suzuki | ............... | H03K 19/0019 326/21 |
| 5,903,170 A * | 5/1999 | Kulkarni | ................ | B82Y 10/00 326/119 |
| 5,978,948 A * | 11/1999 | Ohta | ................ | G01R 31/31701 714/736 |
| 6,069,512 A * | 5/2000 | Rodriguez | ............. | H03K 3/012 327/200 |
| 6,635,934 B2 * | 10/2003 | Hidaka | .............. | H03K 19/0016 257/369 |
| 2004/0041591 A1* | 3/2004 | Forbes | ................. | H03K 19/096 326/95 |

(Continued)

OTHER PUBLICATIONS

Goichi Ono, "Threshold-Voltage balance for minimum supply operation", IEEE J. Solid-State Circuits, vol. 38, No. 5, pp. 830-833 May 2003.

(Continued)

*Primary Examiner* — Don P Le
(74) *Attorney, Agent, or Firm* — Piroozi-IP, LLC

(57) ABSTRACT

A semiconductor building block is disclosed which includes a plurality of logic gates, each having at least one P-channel device, at least one N-channel device, and a current controller controlling current for each of the plurality of logic gate having a voltage source input (vdd), a ground input (vss), a first input current ($ibias_n$) adapted to control current through the at least one N-channel device, a second input current ($ibias_p$) adapted to control current through the at least one P-channel device, and an analog voltage input (delta) representing i) a predetermined ratio between respective on currents in the at least one P-channel device to $ibias_p$, and ii) the predetermined ratio between respective on currents in the at least one N-channel device to $ibias_n$.

20 Claims, 16 Drawing Sheets

(56) References Cited

U.S. PATENT DOCUMENTS

| | | | | |
|---|---|---|---|---|
| 2010/0231263 | A1* | 9/2010 | Fish | H03K 19/0948 326/121 |
| 2010/0259301 | A1* | 10/2010 | Marino | G06F 7/5016 326/112 |
| 2014/0195579 | A1* | 7/2014 | Willson, Jr. | G06F 7/4818 708/440 |
| 2014/0232432 | A1* | 8/2014 | Fish | G06F 9/3869 326/104 |
| 2014/0312936 | A1* | 10/2014 | Abdel-Haleem | H03L 7/193 327/118 |
| 2015/0339420 | A1* | 11/2015 | Fish | H03K 19/20 716/102 |
| 2017/0194950 | A1* | 7/2017 | Hernes | G06F 1/06 |

OTHER PUBLICATIONS

S. K. Samal, Y. Peng, M. Pathak, and S. K. Lim, "Ultralow power circuit design with subthreshold/near-threshold 3-D IC technologies", IEEE Trans. on Packaging and Manufacturing Tech., vol. 5, No. 7, Jul. 2015.

Y. Pu, J. P. De Gyvez, H. Corporaal, and Y. Ha, "An Ultra-low-energy/frame multi-standard JPEG co-processor in 65nm CMOS with sub/near-threshold supply", ISSCC 2009, Session 8.

C. H. Kim, H. Soeleman, and K. Roy, "Ultra-low-power DLMS adaptive filter for hearing aid applications", IEEE Trans. on VLSI Systems, vol. 11, No. 6, Dec. 2003.

A. Tajalli, E. J. Brauer, Y. Leblebici, and E. Vittoz, "Subthreshold source-coupled logic circuits for ultra-low-power applications", IEEE J. Solid-State Circuits, vol. 43, No. 7, pp. 1699-1710, Jul. 2008.

K. A. Jyotsna, P. Satish Kumar, and B. K Madhavi3, "Subthreshold circuit design techniques for ultra low-power applications", International Jour. of Adv. Research in Electrical, Electronicsand Instrumentation Eng., vol. 5, Issue 12, Dec. 2016.

D. Markovic, C.C. Wang, L.P. Alarcon, Tsung-Te Liu, and J. M. Rabaey, "Ultralow-Power Design in Near-Threshold Region", Proceedings of the IEEE, vol. 98, No. 2, Feb. 2010.

R.G. Dreslinski, M. Wieckowski, D. Blaauw, Dennis Sylvester, and T. Mudge, "Near-Threshold Computing: Reclaiming Moores's Law Through Energy Efficient Integrated Circuits", Proceedings of the IEEE, vol. 98, No. 2, Feb. 2010.

Massimo Alioto, "Ultra-low power VLSI circuit design demystified and explained: a tutorial", IEEE Trans. on Circuits and Systems—I, vol. 59, No. 1, Jan. 2012.

J. Lynch, P. P. Irazoqui, "A low power logic-compatible multi-bit memory bit cell architecture with differential pair and current stop constructs", IEEE Trans. on Circuits and Systems—I, vol. 61, No. 12, pp. 3367-3375, Dec. 2014.

* cited by examiner

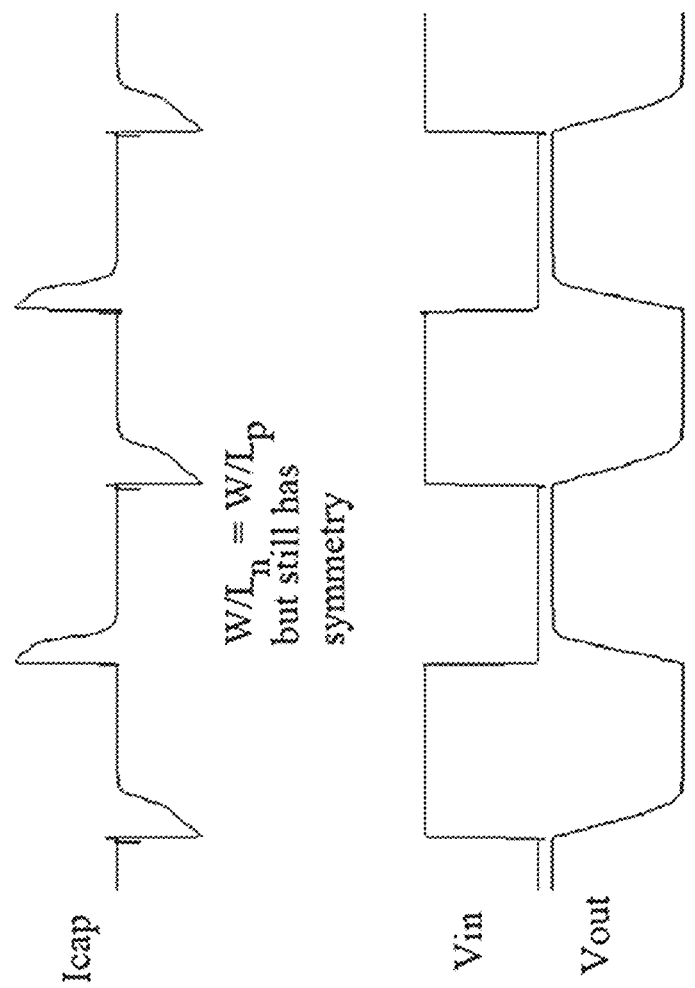

LOW POWER LOGIC FAMILY

CROSS-REFERENCE TO RELATED APPLICATIONS

The present patent application is related to and claims the priority benefit of U.S. Provisional Patent Application Ser. No. 62/814,893, filed 7 Mar. 2019, the contents of which are hereby incorporated by reference in its entirety into the present disclosure.

STATEMENT REGARDING GOVERNMENT FUNDING

This invention was made without government support.

TECHNICAL FIELD

The present disclosure generally logic gate used in electronic circuits, and in particular, to a family of low-power logic family.

BACKGROUND

This section introduces aspects that may help facilitate a better understanding of the disclosure. Accordingly, these statements are to be read in this light and are not to be understood as admissions about what is or is not prior art.

There is increasing interest in reducing the energy consumption and improving the battery in electronic designs. It is well known that lowering the power supply, vdd, is an excellent way to reduce energy in complementary metal oxide semiconductor (CMOS) logic gates as the energy varies proportionally to the square of vdd. However, once vdd is reduced below the absolute value of the threshold voltages of pmos and nmos transistors, digital gates start operating in the sub-threshold region. In this region, the sensitivity of important design parameters relative to variations in the process greatly increases. A significant amount of research has been published in the area of running logic in the sub-threshold and near-threshold (with vdd slightly above threshold) regions. These techniques are mostly focused on either adapting the clock frequency of the sub-threshold circuit or suppressing the variations in the circuit performance. For example, in the prior art implementations, others have attempted to dynamically adjust for the operating frequency of standard CMOS gates with a circuit that needs a delay monitor, a comparator, a clock, and a shift register. These implementations result in significant more complexity, thereby increasing the power and area. Others have also attempted to remove variation in the gate operating frequency by adjusting the sizes of the transistors in the standard gates. They also make the intrinsic load equal to at least 16 fF and specify the input rise/fall time to be 2% of the input switching period. While sizing the gates in this way does reduce the variance in delay for a given operating point, the frequency of the gates over the model corners with vdd at about 0.4 V DC, the variations still top 500%. Additionally, because of the large 16 fF intrinsic load, the gate area is large, thus the power is increased and the speed is decreased.

In some of the work provided in the prior art, adaptive body biasing feedback scheme are implemented using both the n and p transistor tubs to control the statistical variations in the imbalance factor of the p-strengths versus the n-strengths in the logic gates, causing limitations in varying the operating frequency. In yet other approaches found in the prior art, some researchers have used source coupled current mode logic techniques to run in sub-threshold mode (STSCL). Logic design using this technique works in the current domain using differential inputs and differential outputs. Each gate has a current source supplying a tail current. Although STSCL implementations break the tradeoff between power and robustness, these approaches are associated with a penalty of increased number of transistors thereby increasing the complexity and power dissipation.

Therefore, there is an unmet need for a novel approach for subthreshold logic gates that provide simplicity of design, lowered power dissipation, and robust immunity to process variation.

SUMMARY

A semiconductor building block is disclosed. The semiconductor building block includes a plurality of logic gates. Each of the logic gates of the plurality of logic gates includes at least one P-channel device, at least one N-channel device, and a current controller controlling current for each of the plurality of logic gate. The current controller includes a voltage source input (vdd), a ground input (vss), a first input current (ibias$_n$) adapted to control current through the at least one N-channel device, a second input current (ibias$_p$) adapted to control current through the at least one P-channel device, and an analog voltage input (delta) representing i) a predetermined ratio between respective on currents in the at least one P-channel device to ibias$_p$, and ii) the predetermined ratio between respective on currents in the at least one N-channel device to ibias$_n$.

BRIEF DESCRIPTION OF DRAWINGS

FIG. 6 is a relative timing chart of a minimum inverter utilizing the arrangements of the present disclosure (hereinafter referred to as 3C) where a simulation of a minimum inverter with about 0.3 V vdd driving a large 50 fF capacitive load having a current controller is represented.

DETAILED DESCRIPTION

Figure 1:
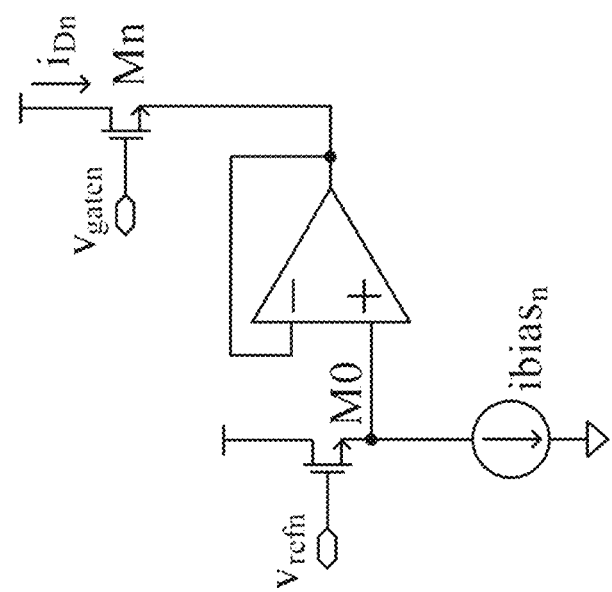
FIG. 1 is a schematic of a simplistic current control aspect of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach for subthreshold logic gates is provided herein that offers simplicity of design, lowered power dissipation, and robust immunity to process variation. Accordingly, the present disclosure describes a new logic implementation that allows for reduced sub-threshold energy use. This novel approach is based on a current-controlled CMOS logic that uses a differential construct to control the logic gate current causing a very large reduction in the standard deviation of the delay and a corresponding reduction in energy use when circuit operates in the sub-threshold regime. The reduction in the delay standard deviation enables an improved operating frequency, a tighter design specification, as well as a digital logic design methodology that includes registered transfer level (RTL) coding as well as synthesis and place and route. This novel design approach is referred to herein as the 3C architecture. It is generally considered best practice to size the p-transistors two or three times larger than the n-transistors in the gates to maintain good symmetry in the output rise and fall times. With the 3C architecture described in the present disclosure such a sizing requirement is not needed. The energy is reduced by allowing for the use of p-transistors that are the same size as the n-transistors while maintaining the desired symmetry. Reduced p-transistor size means reduced capacitance and reduced power. Smaller p-transistors also decrease the area and enable the low energy system to operate at higher frequencies. The implementation also further reduces the energy by adaptive body biasing for p-channel transistor tubs.

A modified differential pair (MDP-modified by inserting a buffer) construct, as depicted in FIG. 1 is an exemplary building block for controlling the current in complementary metal oxide semiconductor (CMOS) digital gates, according to the present disclosure. The MDP removes the effect of within-die threshold voltage by adding a transistor $M_0$ and an operational amplifier (opamp) that serve as a current controller for the transistor $M_n$. Since the within-die threshold voltage of the two neighboring transistors M0 and Mn are effectively equal within a specified tolerance, the voltages cancel each other out and the current in Mn is not a function of within-die threshold voltage. The current in $M_n$ is not a function of the threshold voltage. Kirchhoff's Voltage Law (KVL) around the loop containing the $V_{GS}$'s of the two transistors provides support for this asserted independence. If the drain induced barrier lowering (DIBL) effect of vdd on the current is not included, in general in sub-threshold mode $V_{GS}$ is defined as $$v_{GS} = n\varphi_t \ln(i_D) - n\varphi_t \ln(I_{STR}) \quad (1)$$

where n is the ideality factor,
$\varphi_t = kT/q$ is the thermal voltage,
$i_D$ is the drain current, and
$I_{STR}$ is the sub-threshold current strength defined as $$I_{STR} = I_0 \frac{W}{L} e^{\frac{-Vth_{eff}}{n\varphi_t}} \quad (2)$$

where $I_0$ is the technology-dependent parameter that equals the current when $V_{GS}$ equals $Vth_{eff}$, (the effective threshold voltage including body biasing),
W is the width of the device, and
L is the length of the device. By substituting (1) into the KVL equation for the two transistors, the terms containing $I_{STR}$ cancel out and the result is $$i_{Dn} = ibias_n * e^{\left[\frac{v_{gaten} - v_{refn}}{n\varphi_t}\right]}. \quad (3)$$

The above equation shows that the drain current of Mn is not a function of any threshold voltage. Therefore, the premise is proven that in sub-threshold operation the on-current in the controlled transistor is only a function of the difference between its gate and the reference voltage.

The same analysis can be performed for the MDP operating in near-threshold or super-threshold. Super-threshold refers to operation above threshold where the $I_{DS}$ has a square-law relationship to $V_{GS}$, while subthreshold indicates an exponential relationship between $V_{GS}$ and $I_{DS}$. The term 'near threshold' refers to transition between super-threshold and subthreshold. The approach discussed herein work in all three regions with different expressions. Assuming an ideal nmos transistor, the results of such an analysis is given by $$i_{Dn} = \frac{\mu_0 C_{OX}}{2} \frac{W}{L} \left(v_{gaten} - v_{refn} + \sqrt{ibias_n \frac{2}{\mu_0 C_{OX}} \frac{L}{W}}\right)^2 \quad (4)$$

where $\mu_0$ is the mobility, and
$C_{OX}$ is the gate oxide capacitance density. The drain current is a function of the difference between the gate voltage and the reference voltage but not the threshold voltages. All of the other terms in the equation are constant and in no way depend on the threshold voltage.

Figure 2A:
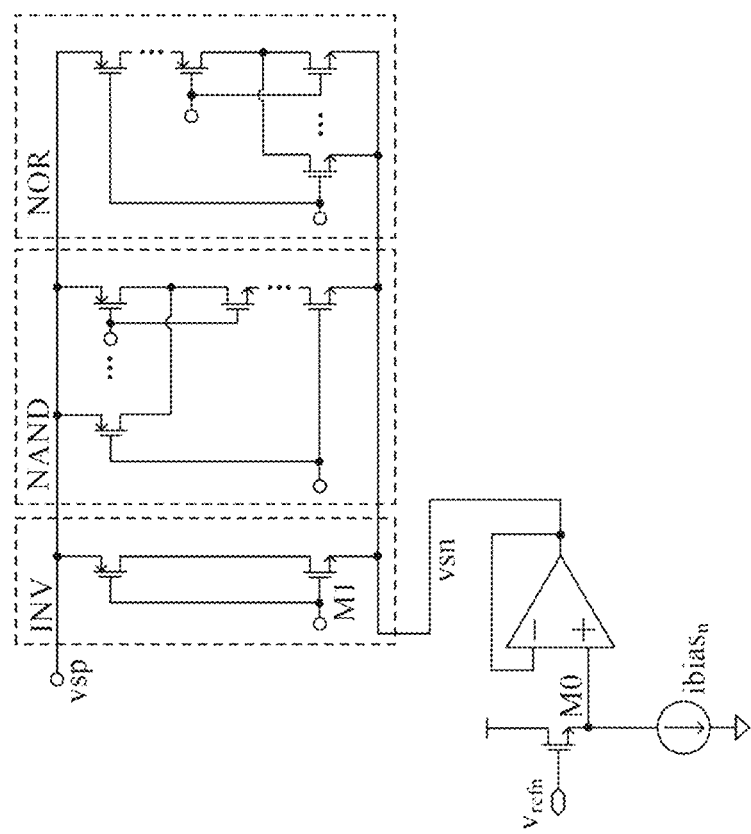
FIG. 2A is a schematic of the simplistic current control aspect of FIG. 1 used on a low-side of a plurality of logic gates.
Figure 2B:
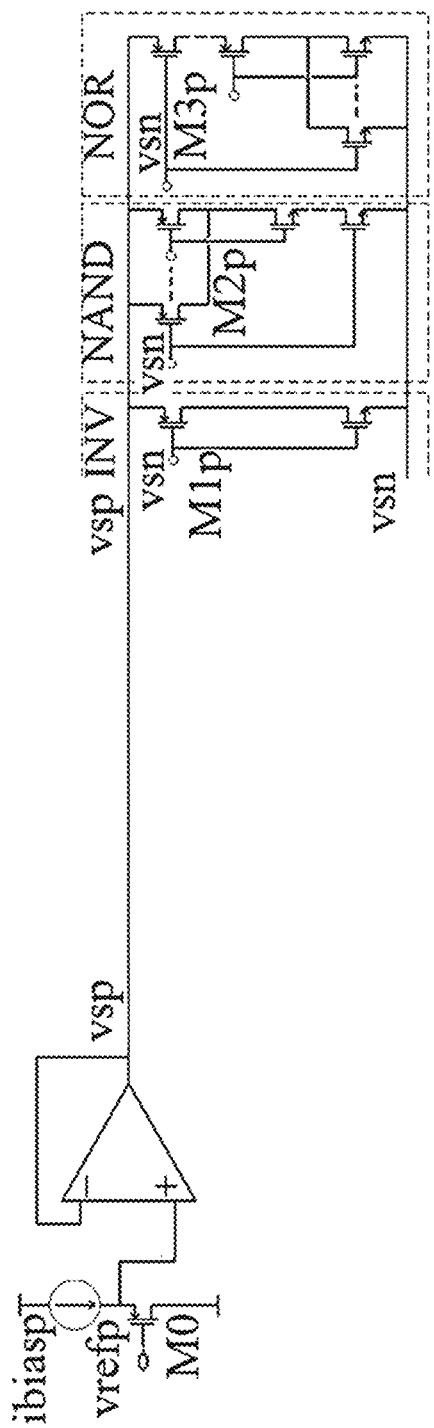
FIG. 2B is a schematic of the simplistic current control aspect of FIG. 1 used on a high-side of a plurality of logic gates.

To demonstrate the applicability and advantage of the logic family discussed herein, reference is made to FIGS. 2A and 2B. The current, $I_{ONn}$, is defined to be the n-channel transistor current in the CMOS digital gates when the gate input is set to the logic HI voltage for vsp. In FIG. 2A, an MDP current controller as described above sets the on-current for all n-channel transistors in the digital gates, while in FIG. 2B, an MDP current controller as described above sets the on-current for all p-channel transistors in the digital gates. The opamp buffers the source of M0 transistor and sets the negative supply, vsn, of all of the digital gates. Since an MDP construct is used, the on-current in the n-channel gate transistors, such as M1, is a function of the difference between the logic HI voltage level of the gate, vsp, and the voltage value of $v_{refn}$. As can be seen, the n-channel current $I_{ONn}$ is not a function of the value of the threshold voltage of the transistors. Equation (3) derived above from the MDP theory of operation applies directly to $I_{ONn}$ with the logic HI voltage, vsp, used in place of $v_{gaten}$.

$$I_{ONn} = ibias_n * e^{\left[\frac{vsp-v_{refn}}{n\varphi_t}\right]} \quad (5)$$

Let's define $\Delta_n = vsp - v_{refn}$. While remaining in sub-threshold mode, as $\Delta_n$ is varied, it can control the n-channel on-current, $I_{ONn}$, in a well-defined way over a very large range, as in an order of magnitude change in current for every one tenth of a volt change in $\Delta_n$. As the operation moves into near-threshold and super-threshold, the control moves into a square-law formulation as in (4).

To better understand the logic family described herein, advantages of this logic family are now discussed. These advantages includes minimizes variance in gate operating frequency; maintaining symmetry with reduced area and increased frequency; and operating at optimal energy. Each of these advantages is now discussed.

The gate operating frequency is the reciprocal of the delay and a single gate delay is the time it takes for the nmos or pmos transistors in that gate to charge the load capacitance to half vdd. The operating frequency for a digital system is generally defined by the logic depth in the critical path and the single gate delay. The operating frequency required by a digital block is usually constrained by the overall system in which it resides. As the supply for a digital logic system is lowered down into the sub-threshold region, the frequency of operation will reduce rapidly. To make matters worse, the reduced operating frequency varies by a large amount over the process corners. The system has a minimum, typical, and maximum operating frequency. Due to the aforementioned variations, there is usually a need to design for the minimum frequency instead of the typical frequency. In addition, during static timing analysis, the setup times are checked with the minimum frequency clock but the hold times are checked using the maximum frequency. The larger the frequency variance the harder it will be to close timing (i.e., making sure all the delays introduced between two clocking elements, e.g., flipflops, by wires or other electronics do not exceed the allotted clock cycles between these clocking elements), especially for large digital designs. In order to measure and compare the frequency variance, we define a figure of merit, Df and specify it as $$Df = [(f_{max} - f_{min})/f_{min}] * 100\%$$

where $f_{min}$ is the minimum frequency of operation, and $f_{max}$ is the maximum frequency of operation due to the variations in process corners.

The operating frequency analysis can be carried out considering either the n-channel charging current or the p-channel charging current. If the nmos is used, in standard CMOS gates the operating frequency in sub-threshold mode is proportional to $I_{ONn}$ divided by vdd. The off-current, $I_{off}$, is defined when $v_{GS}=0$ and $v_{DS}=vdd$. If the DIBL effect is ignored in sub-threshold mode, following (2) $I_{off}$ is defined as:

$$I_{off} \approx I_{STR} = I_0 \frac{W}{L} e^{\frac{-Vth_{eff}}{n\varphi_t}} \quad (7)$$

If equations (1) and (2) are combined, the following result is derived:

$$f_{oper} \propto \frac{I_{off} * e^{\frac{vdd}{n\varphi_t}}}{vdd} \propto \frac{I_0}{vdd} \frac{W}{L} e^{\frac{vdd-Vth_{eff}}{n\varphi_t}} \quad (8)$$

The above makes it clear that for standard CMOS gates the operating frequency is an exponential function of the threshold voltage.

Figure 3:
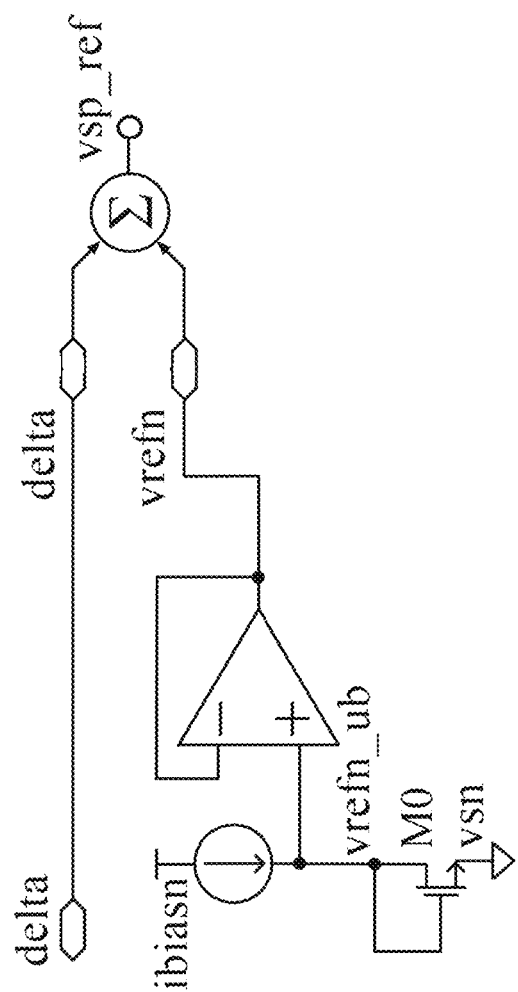
FIG. 3 is a schematic of another embodiment of a current control aspect of the present disclosure.

The MDP construct discussed herein controls the gate on-currents diminishing their sensitivity to the die-to-die parameters. In this way, there is less sensitivity in the gate operating frequency to the process variations, even while operating in the sub-threshold mode. According to the present disclosure, the current controller block is designed to use an n-type MDP construct to control the n-transistor gate on-currents with the positive supply, vsp, according to (5). The logic HI is $$vsp(\text{logic HI}) = v_{refn} + \Delta_n \quad (9)$$

where $\Delta_n$ is the difference between the positive supply and the reference voltage; however, an adjustment is made to the n-type current controller from FIG. 2A to the one depicted in FIG. 3. Referring to FIG. 3, an alternative configuration for an n-type MDP holding vsn at zero volts and varying vsp is shown for logic HI. Instead of varying the n-channel on-currents using vsn with $v_{refn}$ and vsp (logic HI) being constant, the vsn supply is set at zero volts and the n-channel on-currents are varied using vsp, the logic HI supply to the inputs of the logic gates. The reference transistor, M0, is diode connected with a current of $ibias_n$. $v_{refn\_ub}$ is equal to the $v_{GS}$ of M0, and the opamp buffers the signal $V_{refn\_ub}$ and its output, $v_{refn}$, is summed with a signal $\Delta_n$ to create vsp. It is clear that the n-channel on-currents are still the same as in (5) for the configuration in FIG. 3.

Similar to (8), in sub-threshold mode the operating frequency of the current-controlled CMOS gates is proportional to the ratio of the nmos charging current and the positive power supply $$f_{oper} \propto \frac{I_{ONn}}{vsp}. \quad (10)$$

Using $\Delta_n = vsp - v_{refn}$ in (5) and substituting from (1) into (9), the operational frequency is determined as:

$$f_{oper} \propto \frac{ibias_n * e^{\frac{\Delta_n}{n\varphi_t}}}{n\varphi_t \ln\left(\frac{ibias_n}{I_{off}}\right) + \Delta_n} \quad (11)$$

The current $ibias_n$ and the signal $\Delta_n$ in (11) are not functions of threshold voltage. The only term in (11) that has any dependence on the threshold voltage is $I_{off}$. Since this dependence is a natural logarithmic function of an exponential, the operating frequency of the current controlled gates in this work varies linearly with the threshold voltage, not exponentially as with the standard super-threshold/near-threshold CMOS gates.

Figure 4:
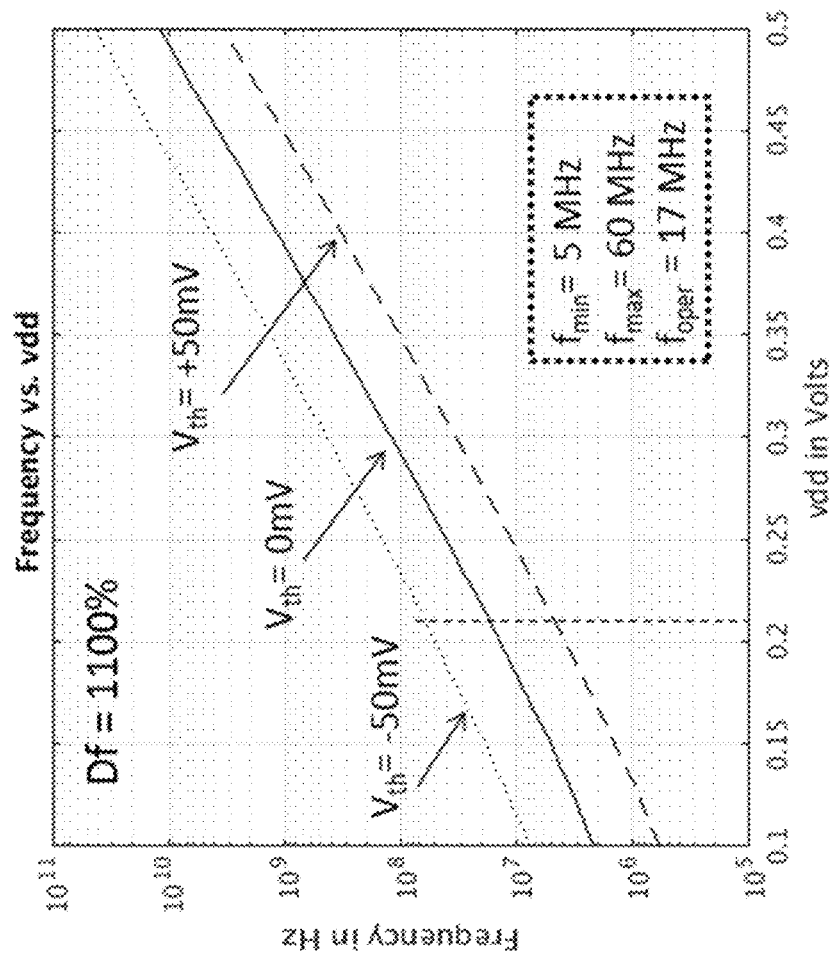
FIG. 4 is a graph of frequency in Hz vs. vdd in volts for three different values of the change in the threshold voltage, $V_{th}$: −50 mV, 0, and 50 mV for standard CMOS gates biased in sub-threshold.

Referring to FIG. 4, a plot of the frequency vs. vdd for three different values of the change in the threshold voltage, $V_{th}$: −50 mV, 0, and 50 mV for standard CMOS gates biased in sub-threshold is provided. At a sample point of vdd of about 0.205 V, when the change in the threshold voltage is zero, the frequency is approximately $f_{oper}$=17 MHz. The variation in sub-threshold performance due to the changing threshold voltage is from $f_{min}$=5 MHz to $f_{max}$=60 MHz. The figure of merit defined in (6), Df for this variation is 1100%, more than an order of magnitude change in the operating frequency for a +/−50 mV change in threshold voltage.

Figure 5:
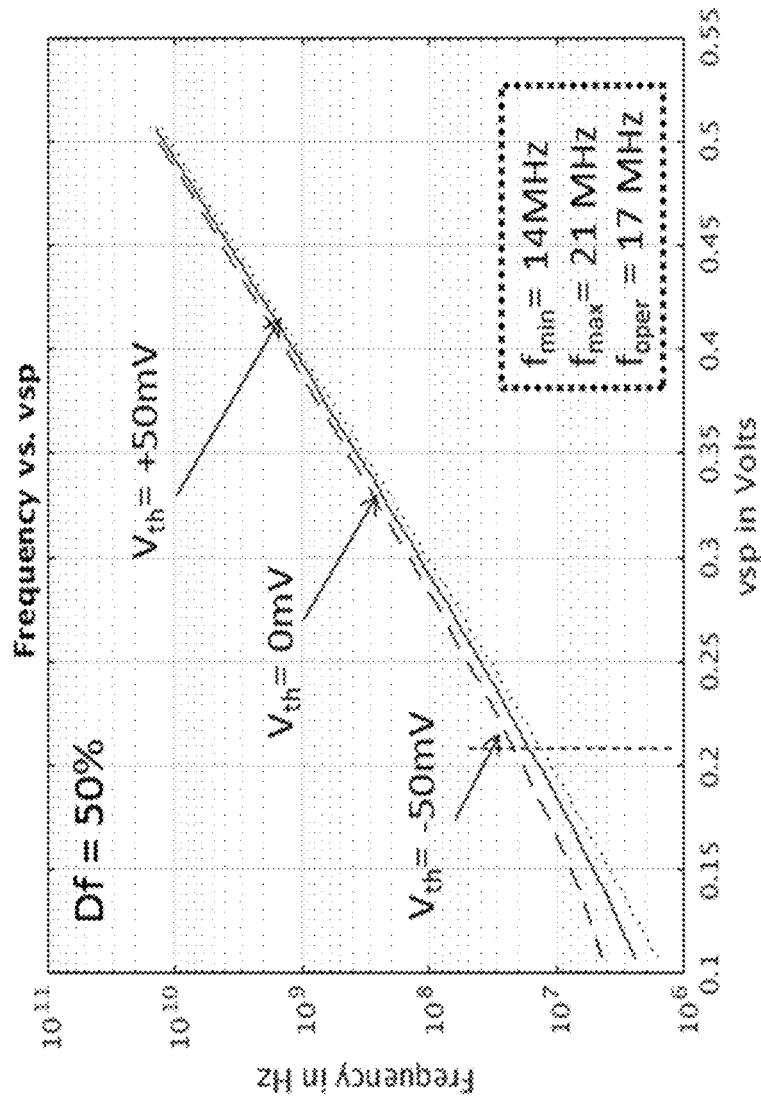
FIG. 5 is a graph of frequency in Hz vs. vdd in volts for three different values of the change in the threshold voltage, $V_{th}$: −50 mV, 0, and 50 mV for the 3C gates of the present disclosure biased in sub-threshold.

Referring to FIG. 5, a graph of frequency in Hz vs. vdd in volts for three different values of the change in the threshold voltage, $V_{th}$: −50 mV, 0, and 50 mV for the 3C gates according to the present disclosure is presented, which is biased in sub-threshold. A comparison of FIGS. 4 and 5 show a variance in gate delays is measured by a figure of merit defined above having a value of about 50% for the 3C gates vs. about 1100% for the standard CMOS gates.

The logic gate operating frequency variance is minimized, even in sub-threshold mode. The system design can have a much tighter timing specification by not having to account for such a high variance. In the above analysis, the $f_{min}$ is 5 MHz for standard gates and is 14 MHz for the 3C logic of the present disclosure. The current controlled logic system can be designed to guarantee a throughput nearly three times higher. Having a smaller variation over process corners enables a digital design flow to be used even in sub-threshold mode and it will allow to close timing with static timing analysis thereby enabling mass production more advantageously than standard CMOS logic.

With respect to the second advantage of the logic family of the present disclosure (i.e., maintaining symmetry with reduced area and increased frequency), it is common practice to make the size of the p-channel transistors larger than the n-channel transistors because of their reduced strength. With the current controlled logic in this work, it is not necessary to make the p-channel transistors larger. This symmetry is achieved because both the n-transistors and p-transistors have independent control of their on-current through their respective MDP based current controller. By adjusting the ratios of the bias currents along with the respective W/L ratios in the reference transistors, the nmos and pmos sizes in the gates are made substantially equal while still maintaining the symmetry.

Referring to FIG. 6, a relative timing chart of a 3C minimum inverter is shown. FIG. 6 is a representation of a simulation of a minimum inverter with about 0.3 V vdd driving a large 50 fF capacitive load having a current controller. For the inverter in this simulation, the pmos transistors have the same dimensions as the nmos transistors. The top curve is the current in the gate, the middle curve is the inverter input and the bottom curve is the inverter output. Note the symmetry in the rise and fall time of the output voltage waveform. The symmetry is achieved even with the p-channel W/L ratio equal to the n-channel W/L ratio.

The result of sizing all of the gates in this way is a reduction in the area and an increase in the speed of the gates. Current controlled logic pmos transistors are half the size, or less, of standard gate pmos transistors and operate at least 30% less capacitance. The lower capacitance enables current controlled gates to operate at higher frequencies. The comparison plot provided in FIGS. 4 and 5 assumed equal capacitance; however, the 3C gates have less capacitance. Therefore, if the standard gates operate at 17 MHz, all other things being equal, the same current controlled gates operate at 22 MHz, or more, while maintaining the improved variance ratio.

The third advantage is operating at optimal energy. At some point as the supply is lowered, the dynamic energy becomes optimally balanced with respect to the static leakage energy thereby creating a minimum in the energy vs. vdd function. The goal is to operate at this ideal minimum energy point if the system frequency constraint can be met. We can observe the minimum in the energy by noting $$E_{tot}=C_{eff}*vdd^2+vdd*I_{off}*T_{CK}=E_{dyn}+E_{lkg} \qquad (12)$$

where $E_{dyn}$ is the dynamic energy,
$E_{lkg}$ is the leakage energy,
$E_{tot}$ is the total energy,
$C_{eff}$ is the effective capacitance, including the activity factor,
vdd is the supply voltage,
$I_{off}$ is the drain current measured with $v_{GS}$=0 and $v_{DS}$=vdd, and
$T_{CK}$ is the clock cycle, which is a function of the gate delay within the critical path, the average stacking factor within the gates, and the logic depth. The dynamic energy decreases at a rate of vdd squared as the supply is lowered. As the supply is lowered to enter the sub-threshold region, the leakage energy increases exponentially as the supply due to the increasing gate delay. It can be shown that the leakage energy term in becomes proportional to $I_{off}/I_{on}$ and therefore the energy is not a function of the threshold voltage as long as the operation remains in the sub-threshold region. The frequency of operation of the gates in sub-threshold mode is indeed a function of threshold, but the shape of the energy curve is not.

An imbalance factor (IF) is defined which sets a practical lower bound for the supply voltage. The IF is a statistical mismatch of the p-channel transistor strengths compared to the n-channel strength. The IF parameter is much greater in sub-threshold mode. If the imbalance factor increases enough, the dc characteristics are degraded and the noise margin decreases.

There is a lower bound in vdd value, called $VDD_{break}$, which causes the gates to stop functioning correctly due to lack of positive noise margin. $VDD_{break}$ needs to be lower than the $VDD_{ideal\_min}$ point, in order to be able to operate at the optimum energy.

Equation (13) defines the imbalance factor as the ratio of the strength defined in (2) for the pmos and nmos transistors regardless of whether the stronger one is n or p.

$$IF = \max\left(\frac{I_{STRp}}{I_{STRn}}, \frac{I_{STRn}}{I_{STRp}}\right) \geq 1. \qquad (13)$$

For the commercial 180 nm process used according to the present disclosure, the IF is between 80 and 100 when considering the 'sf' or the 'fs' model corner files in sub-threshold mode, known to a person having ordinary skill in the art. Of course, the intra-die variations might add to that number, so a given gate might have an IF in the hundreds, even thousands. Whereas at a vdd of 1 V in super-threshold, the IF for the same extreme corner models would be about 2 or 3.

A rule of thumb in calculating the $VDD_{break}$ point for a given gate as a function of IF is:

$$VDD_{break} = VDD_{min\text{-}theory} + n\varphi_t \ln(IF) = 200 \text{ mV (for } IF = 50) \quad (14)$$

w $VDD_{min\text{-}theory}$ is the theoretical limit for an inverter's vdd which is on the order of 50 mV. With an IF value of 50 the value of $VDD_{break}$ will increase to about 200 mV here.

Figure 7A:
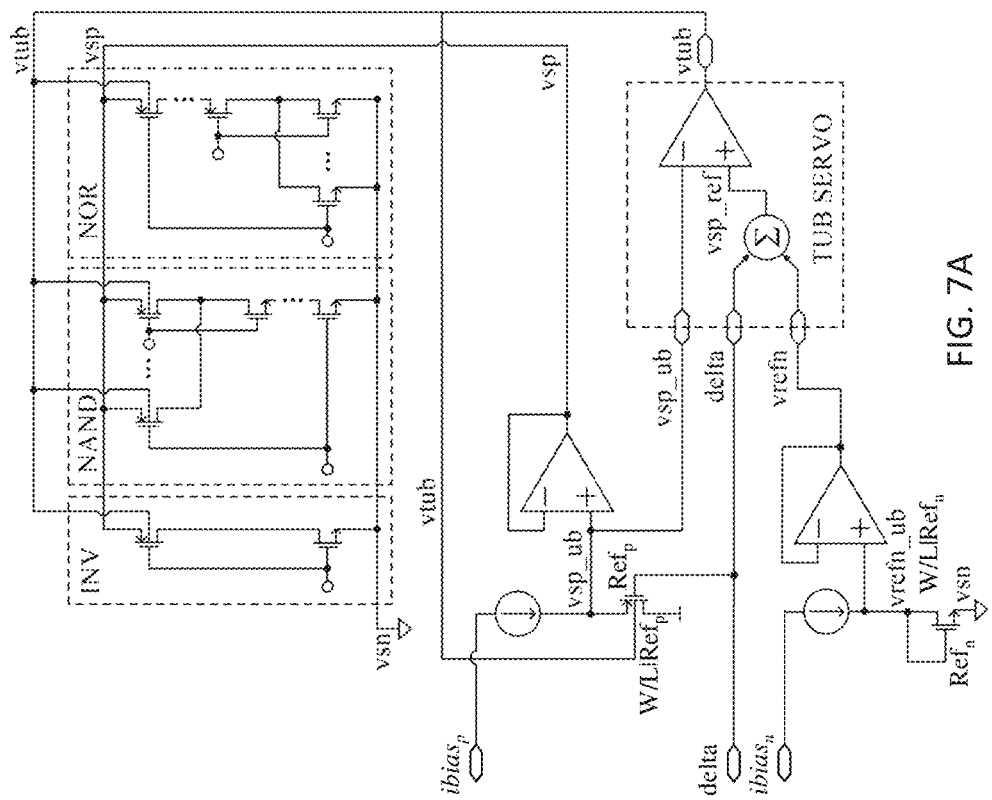
FIG. 7A is a schematic of another embodiment of a current control circuit providing supply and body voltage to a plurality of logic gates according to the present disclosure.

The variation in IF is greatly improved with a servo for the n-well connections for all of the p-channel gate transistors as is depicted in FIG. 7A, which shows a schematic of a circuit to servo only the n-well tubs of the p-transistors in the logic gates to control the IF. Only the p-channel tubs are used. The tubs of the n-channel gate transistors are not needed in the IF control process and instead of tying the n-channel tubs to ground they can be used to adjust the frequency. In sub-threshold mode, the gate operating frequency is a strong function of the threshold voltage and body biasing is a good hook to control the frequency. The input delta represents both $\Delta_n$ and $\Delta_p$ and is an analog voltage representing the desired ratio between the respective on-currents in the gates to the bias currents in the reference transistors. While not shown in FIG. 7A, the input delta can comprise two separate inputs $delta_n$ and $delat_p$ each representing a desired ratio between the on-currents of the respective transistors (e.g., n-channel transistors) and the ibias (e.g., $ibias_n$). The input delta is on the gate of the reference transistor for a p-type MDP and directly sets the on-currents in the p-channel transistors in the gates. The negative supply, vsn, is at ground and the positive supply, vsp, is whatever the MDP p-type current controller makes it to be to establish the desired ratio of p-channel gate on-currents with respect to $ibias_p$. The value of vsp_ub on the source of the MDP reference transistor is $v_{SGp}$ higher than delta.

Figure 7B:
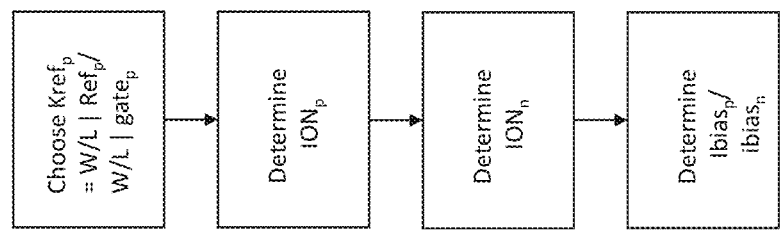
FIG. 7B is a flowchart of how to choose various component parameters of circuit components of FIG. 7A.

When designing the controller, steps shown in the flow-chart of FIG. 7B can be followed. In FIG. 7A, there are two switches that establish vtub (i.e., the body voltage of the switches in the building block). One switch establishes vrefn. This switch is referred to in FIG. 7A as $Ref_n$. vrefn is summed with delta to generate vsp_ref. The other switch is referred to in FIG. 7A as $Ref_p$. The output of this switch establish vsp_ub. The latter is combined with vsp_ref to establish the vtub. Initially, one assumes $Kref_n$ which is defined as the width/length ratio (W/L) of $Ref_n$ to W/L of the n-channel switches in the building block (i.e., W/L|$Ref_n$/W/L|nchannel) to be about 1. Then at the next step shown in FIG. 7B, one chooses $Kref_p$ which is the ratio of W/L of $Ref_p$ to W/L of the p-channel switches in the building block (i.e., W/L|$Ref_p$/W/L|pchannel). Generally, $Kref_p$ represents how much weaker a p-channel transistor is as compared to an n-channel transistor (e.g., $Kref_p$ may be between 2 and 3). Next as provided in FIG. 7B, one determines the on current ($I_{ONp}$) for p-channels by switching input to the building block (e.g., an inverter) low. $I_{ONp}$ is determined by:

$$I_{ONp} = ibias_p / Kref_p \, e^{delta/n\varphi t} \text{ where}$$

φt is the thermal voltage of the p-channel. Next as provided in FIG. 7B, one determines the on current ($I_{ONn}$) for n-channels by switching input to the building block (e.g., an inverter) high.

$I_{ONn}$ is determined by:
$I_{ONn} = ibias_n \, e^{delta/n\varphi t}$. Next the ratio of $I_{ONn}$ to $I_{ONp}$ can be determined by combining the latter two equations as:
$I_{ONn}/I_{ONp} = Kref_p \, (ibais_p/ibias_n)$. To avoid corner process variations, one may wish to have this ratio ($I_{ONn}/I_{ONp}$) to be as close to 1 as possible. With that, the ratio $ibais_p/ibias_n$ can be evaluated as $1/Kref_p$.

The output of the opamp in the tub servo is tied to the tub of the reference p-transistor as well as all of the tubs of the gate p-transistors. The body effect adjusts the threshold voltage of the p-transistors. At the input of the servo opamp, the output of the summation block, vsp_ref, is compared with the servo opamp to vsp_ub, an un-buffered version of vsp. The threshold voltages of the p-transistors are adjusted to meet the condition vsp (logic HI)=$v_{refn}+\Delta_n$ thereby setting the n-channel on-currents to have the correct ratio to $ibias_n$. Therefore, first the p-type current controller sets the p-channel currents with respect to $ibias_p$. Then the tub servo sets the p-channel threshold voltage to make the n-channel currents equal to the p-channel currents. The imbalance factor is adaptively controlled thereby maintaining the desired symmetry in the VTCs of the gates, even in the presence of the extreme corners of the process, such as weak p's and strong n's, and vice versa.

The building blocks shown in FIG. 7A includes three analog inputs (ibiasp, ibaisn, and delta) and one or more digital inputs (e.g., single input to the inverter, or double inputs to the NAND or NOR gates), each digital input operating at a subthreshold or super-threshold level and a digital output. These building blocks also have vdd at the subthreshold or super-threshold. By adjusting the analog inputs, the logic gates according to the present disclosure can be operated in subthreshold or super-threshold regimes without the deleterious effect of process variation. Furthermore, the p-channel devices can be designed to have substantially the same well sizes as the n-channel device which provides a significant improvement over the prior art, especially considering the subthreshold operation.

Figure 8:
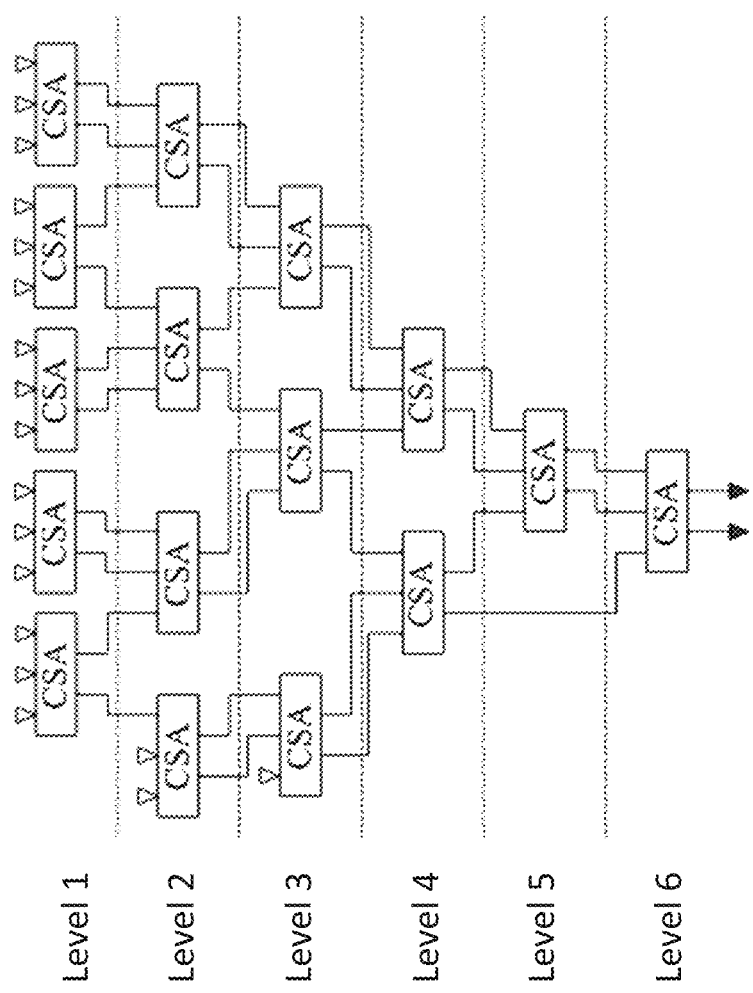
FIG. 8 is a sample conceptual schematic of an 8-bit Wallace Tree multiplier, showing a six-level tree.

To demonstrate the efficacy of the logic family of the present disclosure, an 8-bit Wallace Tree multiplier, a sample conceptual schematic of which is provided in FIG. 8 showing a six-level tree where CSA represents carry-save-add, as known to a person having ordinary skill in the art, is implemented using both standard CMOS gates and custom 3C gates. The process is a 45 nm silicon on insulator (SOI) process from GlobalFoundries. For the 3C gates, it is necessary to use the provided p-channel transistors that have an n-well contact in the gates. These p-channel transistors have more capacitance and are larger than their counterparts without the n-well connection; however, it is an un-avoidable penalty when using this process. For the Wallace Tree multiplier that is implemented, partial products acquired by AND gating all of the inputs with each other are progressively reduced until there are two words left to be added. There is one stage of pipelining inserted right before the final addition.

Figure 9:
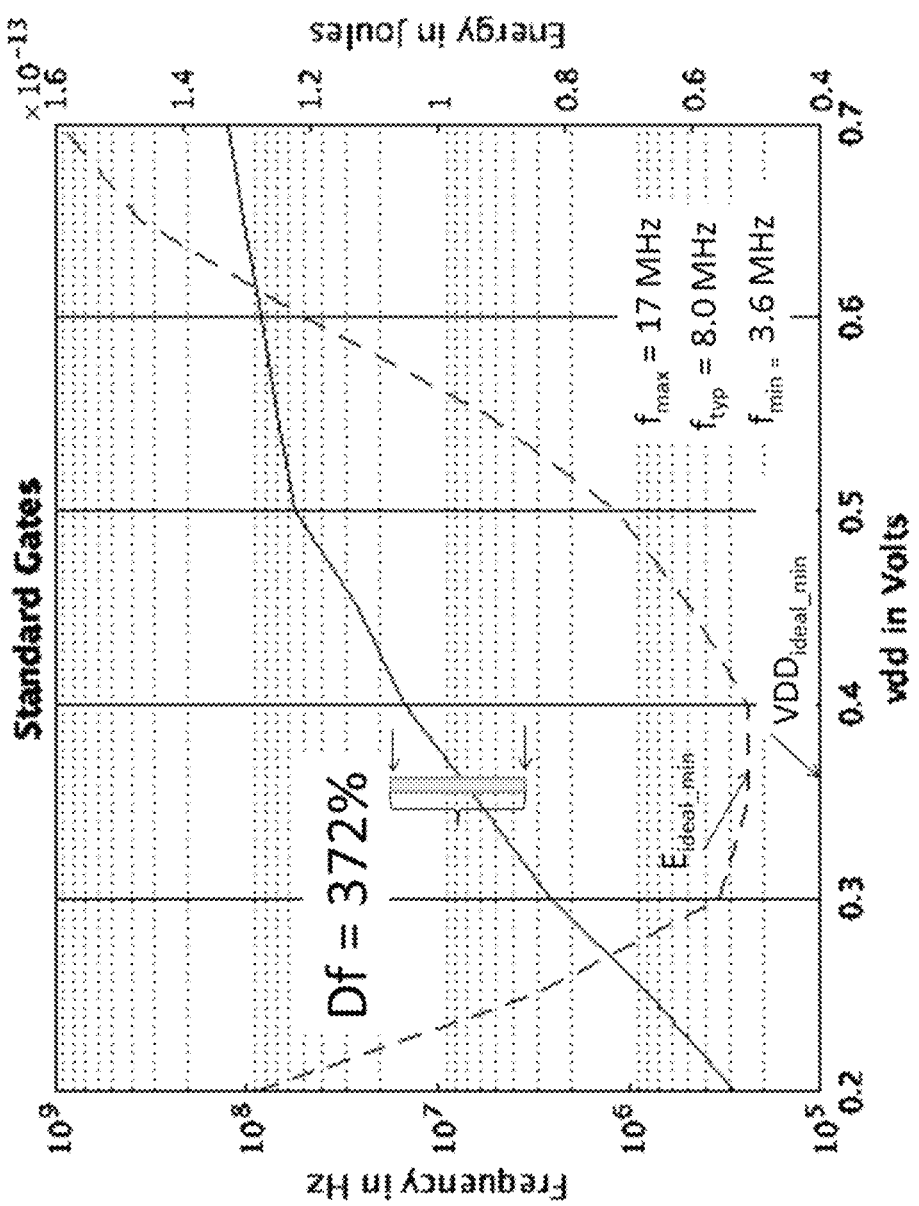
FIGS. 9 and 10 are graphs of frequency vs. supply voltage input in volts and energy in joules vs. the supply voltage which show the results for the multiplier if FIG. 8 in the standard gates (FIG. 9) and for the 3C logic (FIG. 10), respectively, wherein the solid line in both plots represents the multiplier operating frequency determined by measuring the delay up to the input to the pipeline stage.
Figure 10:
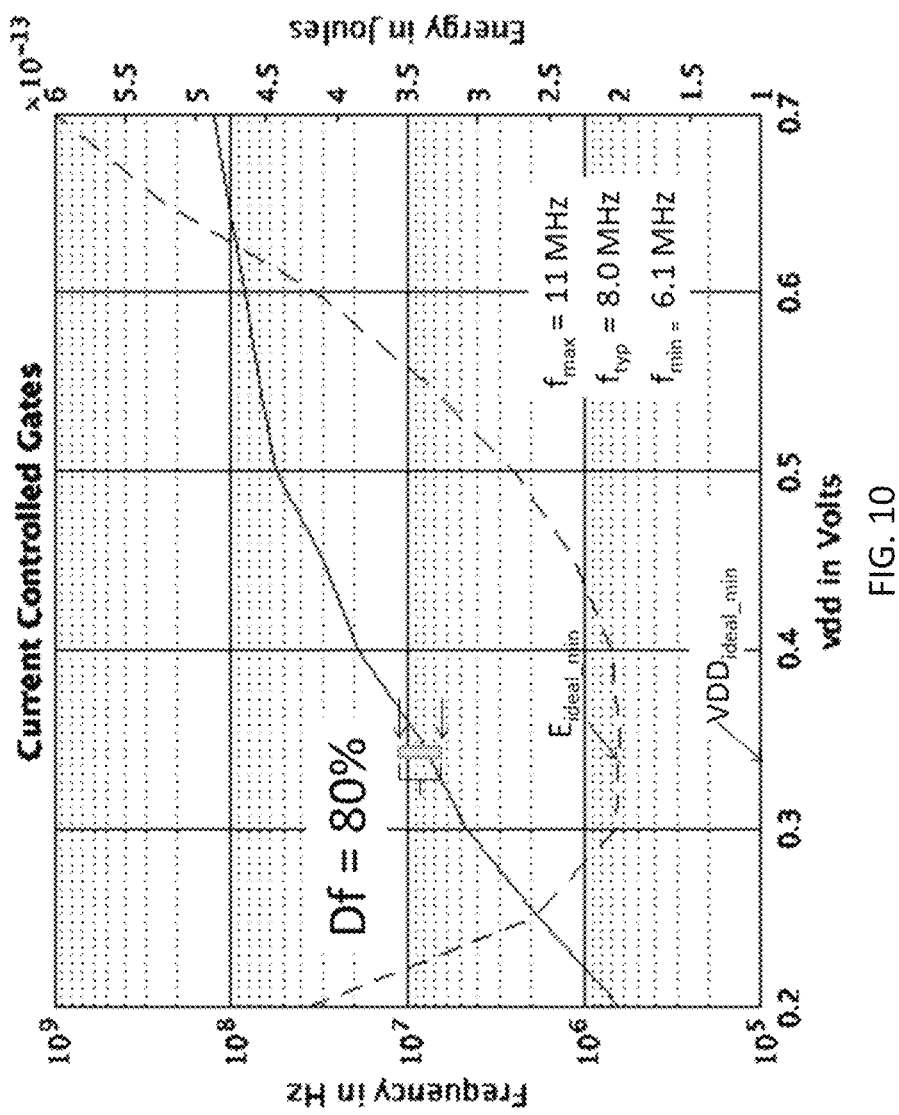

A full analog transistor simulation applying random 8-bit words to each of the inputs is generated. The energy and operating frequency versus vdd is measured with the simulation. FIG. 9 shows the results with a plot for the multiplier in the standard gates. Likewise, FIG. 10 gives the results for the 3C logic. The solid line in both plots represents the multiplier operating frequency determined by measuring the delay up to the input to the pipeline stage. To represent the total multiplier delay, that result is multiplied by ten for a cushion that is consistent with the static timing analysis for the digital gates. The dotted line is for the total energy and is determined by measuring the power and multiplying by the delay.

The optimal energy point for the standard gates is for vdd equals about 0.37 V DC and for the 3C logic case it is equal to about 0.34 V DC. In both cases, operation at the vdd for the minimum energy point is close to the near threshold regime. Both designs run at a typical frequency of 8 MHz with the optimal vdd.

With vdd at the optimal point, two more simulations are run with the fast and slow corners and the delay for each case is noted. The FOM defined in (6) for the standard gates is 372% while for the 3C gates it is 80%. The conclusion to be drawn from this data about the performance of the Wallace Tree multiplier designed with 3C logic is that it is fully functional from about 0.2 to about 0.7 and at the optimal energy point the frequency variance is improved by nearly 5× compared to the standard gates.

Standard cells for the 3C gates are needed so place and route tools, known to a person having ordinary skill in the art, can be used. When creating a standard cell library of 3C digital gates, GDSii (a database file format which is the industry standard use by designers of integrated circuits) layout of the library cells needs to be layout vs. schematic (LVS) and design rult checking (DRC) clean both standalone and also when the cells are stitched together. It is also necessary that the pins be on a grid with the correct pitch suitable for routing. The height and width of the cells need to be multiples of the pitch.

To this end, a standard cell library for the 3C digital gates has been created. There are 18 cells total. The target process is an 180 nm commercial process. The cells all have a standard height. Some are 2× taller and the width is a multiple of an appropriate minimum site size. The terminals are all on the routing grids. The list of cells in the 3C standard cell library is as follows: invx1, invx2, invx4, bufx1, bufx2, bufx4, nand2×1, nand3×1, nand4×1, nor2×1, nor3×1, nor4×1, dffr, dffs, xor2, latchx3, latch_nores, tsinvx1. In addition, Library Exchange Format (LEF) files which represent the GDSii layout in an ASCII format have also been created. To create the LEF file from the GDSii layouts, we use an abstract generator tool to make a text file with a '.lef' extension. Thus, to enable place and route LEF views for all eighteen of the standard cells were generated. In addition, a synthesis library was also created including minimum and maximum corners with vdd of about 0.3V DC for the custom standard cell library in the commercial 180 nm process.

Utilizing these libraries and other tools known to a person having ordinary skill in the art, we extensively simulated synthesized gates for a clock dividers at the transistor level. We compare the performance of the clock divider blocks between the standard cell and 3C logic versions of the design. In general, it is observed from the synthesis report for both the standard cell and 3C gate cases that a large portion of the total power, about half, comes from the clock divider cells.

We ran the complete clock divider chain for both gate architectures with vdd from about 0.2 V to about 1.0 V over five different model corners and measured the delay of the divider chain. The data from these simulations are plotted in FIG. 11 (which is a graph of frequency in Hz vs. vdd in volts showing simulation results for clock divider block over corners with 3C logic) illustrating variance in operating frequency for the 3C logic and in FIG. 12 (which is a graph of frequency in Hz vs. vdd in volts showing simulation results for clock divider block over corners with standard CMOS blocks). The improved variance in the delay data with respect to corners for the current controlled gates is evident from the graphs. The min. to max. difference, Df, equals 50% for the 3C logic and 5600% for the standard cell gates when vdd equals about 0.3V. At about 0.3V the minimum frequency for the 3C logic case is 40 KHz whereas for the standard gates it is 5 KHz, more than 8× more guaranteed improvement in the delay for the clock divider.

Figure 11:
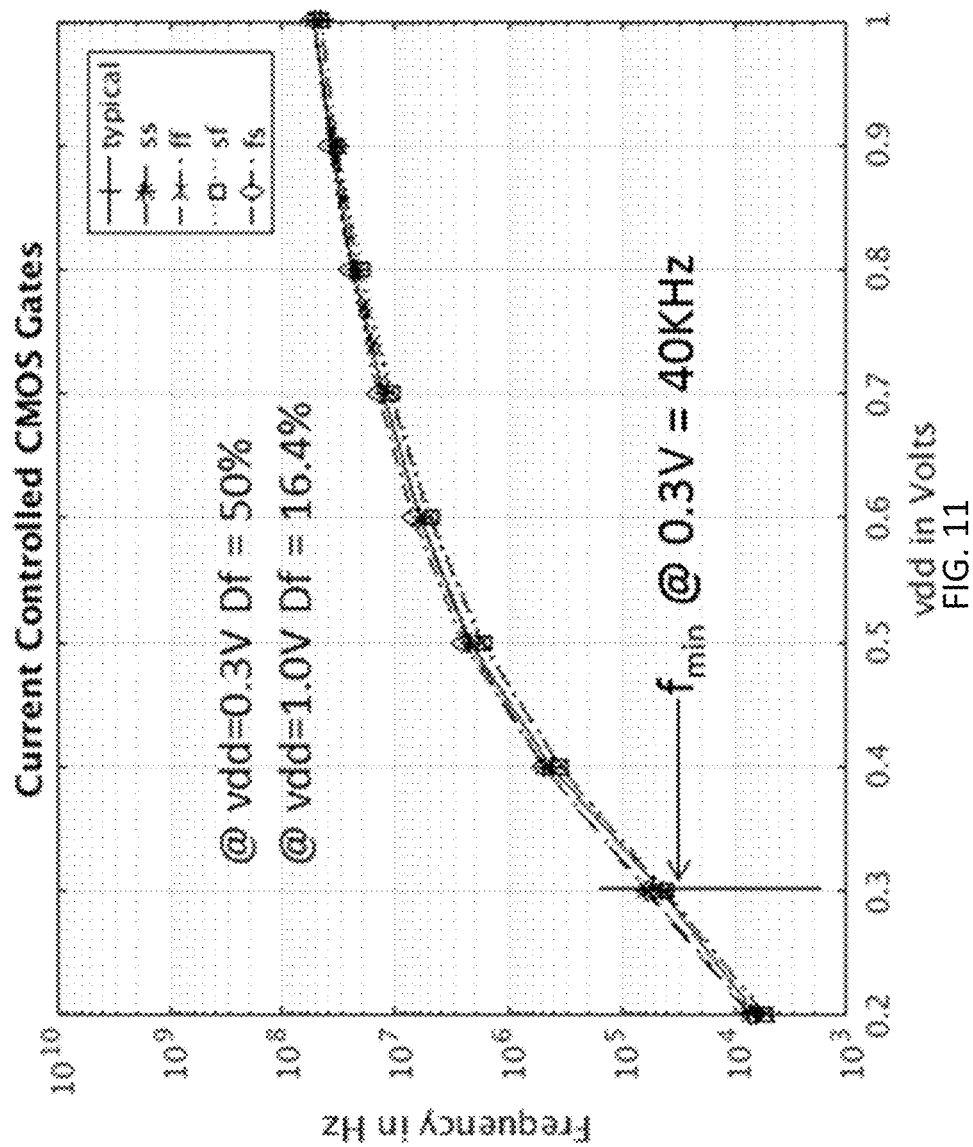
FIGS. 11 and 12 are graphs of frequency in Hz vs. vdd in volts showing simulation results for a clock divider block over process corners where the clock divider was operated for both gate architectures with vdd from about 0.2 V to about 1.0 V over five different model corners (FIG. 11 shows the 3C logic and FIG. 12 shows the standard CMOS blocks).
Figure 12:
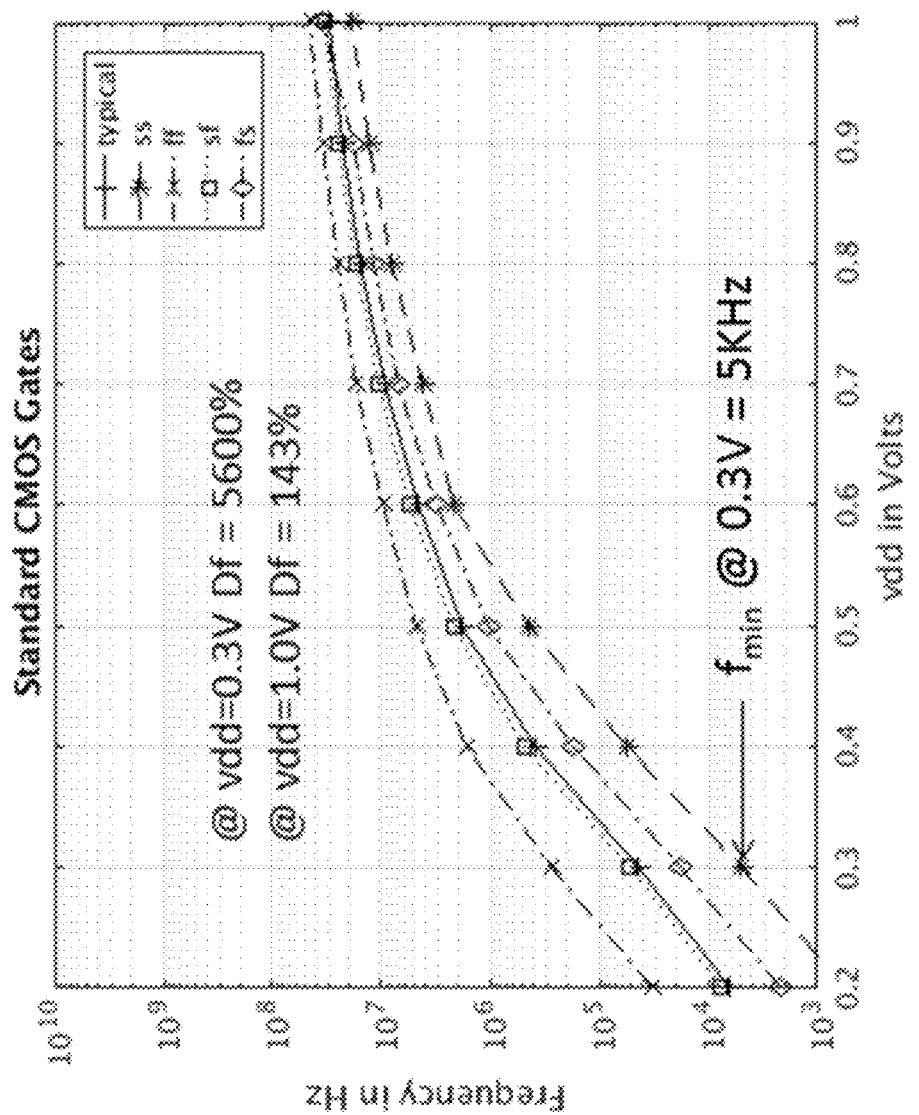
Figure 13:
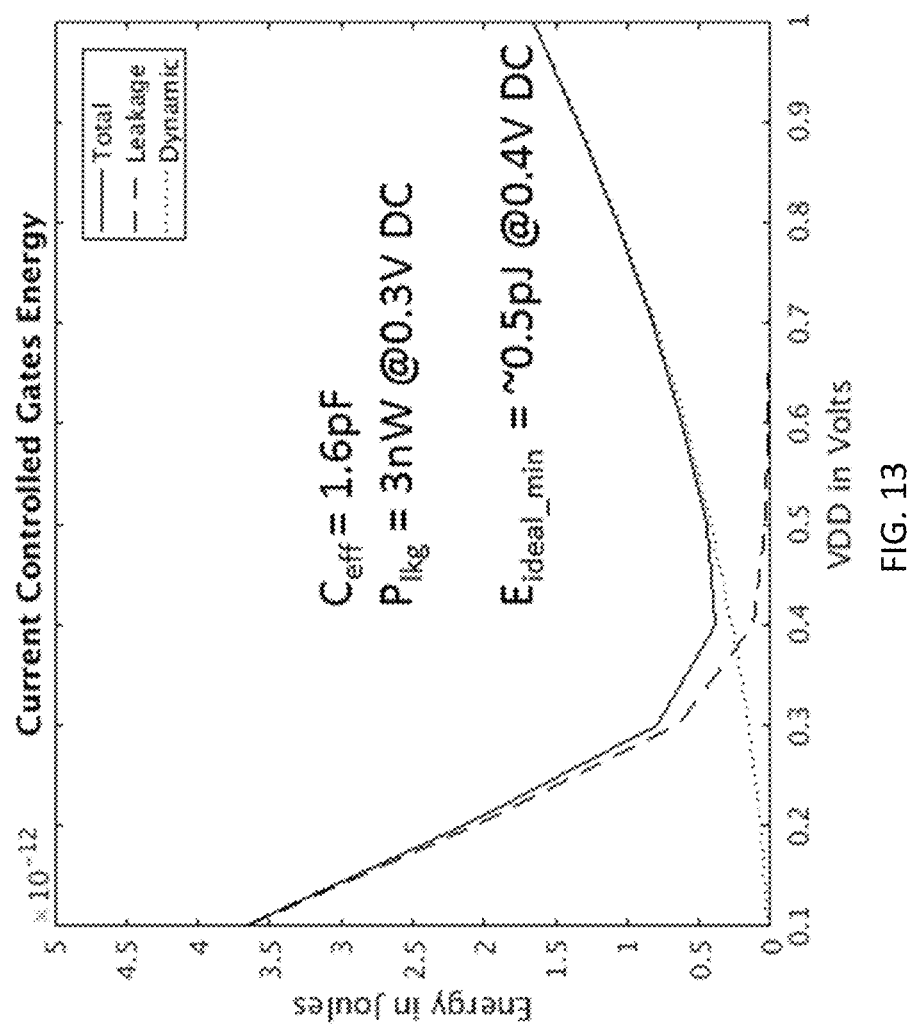
FIGS. 13 and 14 are graphs of energy in Joules vs. vdd in volts which plot the total energy, leakage energy, and dynamic energy for an encryption block in 3C logic and the standard CMOS blocks, respectively.
Figure 14:
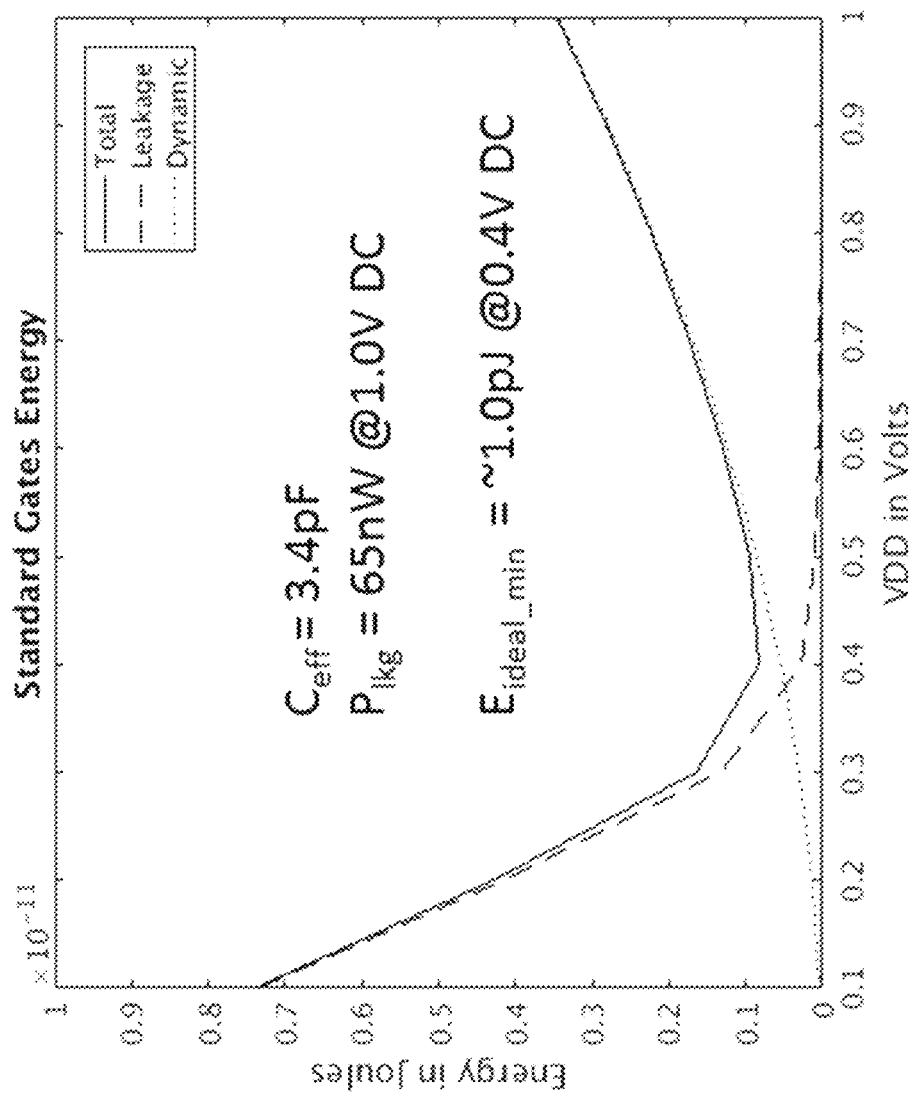

Between the synthesis reports and the data from the transistor simulations, there is enough information to estimate the vdd of the optimal energy from (12). For the 1.0 V standard design the effective capacitance, including the switching activity factor, equals 3.4 pF. For the 0.3 V 3C logic design, it equals 1.6 pF. The leakage power is 65 nW for the 1.0 V standard design and is 3 nW for the 0.3 V 3C logic design. The transistor simulation data that is plotted in FIGS. 11 and 12 are divided by ten to represent an appropriate ratio between the static timing analysis and the delay of the clock divider block. From all of these values FIGS. 13 and 14 (which are energy in Joules vs. vdd in volts) which plot the total energy, leakage energy, and dynamic energy from (12) for an encryption block in 3C logic and the standard case, respectively. These figures show the vdd for optimal energy for both designs is about 0.4 V DC.

While the present disclosure has been mainly directed to sub-threshold region, it should be appreciated that the same approach discussed herein can be used for super-threshold region as well.

Those having ordinary skill in the art will recognize that numerous modifications can be made to the specific implementations described above. The implementations should not be limited to the particular limitations described. Other implementations may be possible.

The invention claimed is:

1. A semiconductor building block, comprising:
    a plurality of logic gates, each having
        at least one P-channel device,
        at least one N-channel device, and
    a current controller controlling current for each of the plurality of logic gate, having
        a voltage source input (vdd),
        a ground input (vss),
        a first input current ($ibias_n$) adapted to control current through the at least one N-channel device,
        a second input current ($ibias_p$) adapted to control current through the at least one P-channel device, and
        an analog voltage input (delta) representing i) a predetermined ratio between respective on currents in the at least one P-channel device to $ibias_p$, and ii) the predetermined ratio between respective on currents in the at least one N-channel device to $ibias_n$,
    wherein the on-current through the at least one P-channel device and the on-current through the at least one N-channel device are substantially equal and are controlled by a current control circuit, and
    wherein the current control circuit is adapted to utilize $ibias_p$, $ibias_n$, and delta to generate i) a controlled supply voltage (vsp) for the at least one P-channel device, and ii) a controlled body voltage (vtub) for the at least one P-channel device.

2. The semiconductor building block of claim 1, wherein vdd is adapted to be connected to a voltage source providing voltage in a subthreshold region.

3. The semiconductor building block of claim 1, wherein vdd is adapted to be connected to a voltage source providing voltage in a near threshold region.

4. The semiconductor building block of claim 1, wherein vdd is adapted to be connected to a voltage source providing voltage in an above-threshold region.

5. The semiconductor building block of claim 1, wherein the plurality of gates includes an inverter.

6. The semiconductor building block of claim 1, wherein the plurality of gates includes a NAND gate.

7. The semiconductor building block of claim 1, wherein the plurality of gates includes a NOR gate.

8. The semiconductor building block of claim 1, wherein the plurality of gates includes a complex gate.

9. The semiconductor building block of claim 8, wherein the complex gate is a NAND-NOR gate.

10. The semiconductor building block of claim 1, wherein variance in gate delays of the at least one P-channel device and the at least one N-channel device is measured by a figure of merit having a value of about 50%.

11. A semiconductor building block, comprising:
a plurality of logic gates, each having
at least one P-channel device,
at least one N-channel device, and
a current controller controlling current for each of the plurality of logic gate, having
a voltage source input (vdd),
a ground input (vss),
a first input current ($ibias_n$) adapted to control current through the at least one N-channel device,
a second input current ($ibias_p$) adapted to control current through the at least one P-channel device, and
an analog voltage input (delta) representing i) a predetermined ratio between respective on currents in the at least one P-channel device to $ibias_p$, and ii) the predetermined ratio between respective on currents in the at least one N-channel device to $ibias_n$,
wherein variance in gate delays of the at least one P-channel device and the at least one N-channel device is measured by a figure of merit having a value of about 50%.

12. The semiconductor building block of claim 11, wherein vdd is adapted to be connected to a voltage source providing voltage in a subthreshold region.

13. The semiconductor building block of claim 11, wherein vdd is adapted to be connected to a voltage source providing voltage in a near threshold region.

14. The semiconductor building block of claim 11, wherein vdd is adapted to be connected to a voltage source providing voltage in an above-threshold region.

15. The semiconductor building block of claim 11, wherein the on-current through the at least one P-channel device and the on-current through the at least one N-channel device are substantially equal and are controlled by a current control circuit.

16. The semiconductor building block of claim 15, wherein the current control circuit is adapted to utilize $ibias_p$, $ibias_n$, and delta to generate i) a controlled supply voltage (vsp) for the at least one P-channel device, and ii) a controlled body voltage (vtub) for the at least one P-channel device.

17. The semiconductor building block of claim 11, wherein the plurality of gates includes an inverter.

18. The semiconductor building block of claim 11, wherein the plurality of gates includes a NAND gate.

19. The semiconductor building block of claim 11, wherein the plurality of gates includes a NOR gate.

20. The semiconductor building block of claim 11, wherein the plurality of gates includes a complex gate, wherein the complex gate is a NAND-NOR gate.

* * * * *